United States Patent [19]
Drayton et al.

[11] Patent Number: 5,913,134
[45] Date of Patent: Jun. 15, 1999

[54] MICROMACHINED SELF PACKAGED CIRCUITS FOR HIGH-FREQUENCY APPLICATIONS

[75] Inventors: Rhonda Franklin Drayton, Ann Arbor; Linda P. B. Katehi, Northville, both of Mich.

[73] Assignee: The Regents of the University of Michigan, Ann Arbor, Mich.

[21] Appl. No.: 08/763,555

[22] Filed: Dec. 5, 1996

Related U.S. Application Data

[62] Division of application No. 08/301,131, Sep. 6, 1994, Pat. No. 5,608,263.

[51] Int. Cl.$^6$ .......................... H01L 21/20; H01L 21/60; H01L 29/80; H01P 3/08
[52] U.S. Cl. ........................... 438/456; 438/51; 438/125; 438/692; 257/275; 257/684; 257/728; 333/246; 333/247
[58] Field of Search .................................... 257/275, 684, 257/728; 333/246, 247; 438/51, 125, 456, 692

[56] References Cited

U.S. PATENT DOCUMENTS 4,550,296 10/1985 Ehrlinger et al. .
5,311,153 5/1994 Lau et al. .

OTHER PUBLICATIONS

"Micromachined Conformal Package for Microwave and Millimeter–Wave Application"' IEEE MTT–S Digest, pp. 1387–1390, 1995.
Walid Y. Ali–Ahmad, William L. Bishop, Thomas W. Crowe, and Gabriel M. Rebeiz; A 250 GHz Planar Low Noise Schottky Receiver; International Journal of Infrared and Millimeter Waves; vol. 4, 1993, pp. 737–749.
Walid Y. Ali–Ahmad, et al.; A Submillimeter–Wave Planar Low Noise Schottky Receiver; 1993, IEEE MTT–S Digest, pp. 527–530.
Walid Y. Ali–Ahmad, et al.; An 86–106 GHz Quasi–Integrated Low Noise Schottky Receiver, IEEE, Transactions on Microwave Theory and Techniques, vol. 41, No. 4, Apr. 1993, pp. 37–39.
Walid Y. Ali–Ahmad, Gabriel M. Rebeiz; A 335 GHz Quasi–Optical Schottky Receiver; IEEE Microwave and Guided Wave Letters; vol. 4, No. 2, Feb. 1994, pp. 37–39.
George Vassos Eleftheriades; Analysis and Design of Integrated–Circuit Horn Antennas for Millimeter and Submillimeter–Wave Applications; Dissertation, University of Michigan 1993.
Walid Youssef Ali–Ahmad; Millimeter and Submillimeter–Wave Integrated Horn Antenna Schottky Receivers; Dissertation, University of Michigan 1993.
Bryzek, Petersen, and McCulley; Micromachines on the March; IEEE Spectrum, May 1994, pp. 20–31.
Eugene D. Jungbluth; Waveguide and Detector Integrated on Silicon; May 1994, Laser Fucus World, pp. 38–40.
Nikkei Weekly; Micromachine Manufacturing Gets Boost; Science & Technology May 9, 1994.

(List continued on next page.)

*Primary Examiner*—Olik Chaudhuri
*Assistant Examiner*—Alonzo Chambliss
*Attorney, Agent, or Firm*—Harness, Dickey & Pierce, PLC

[57] ABSTRACT

A micromachined self-packaged circuit provides at least partial shielding of a circuit element. Preferably, all the elements comprising a circuit are completely shielded between a first wafer of semi-conductor material having a recess and receiving a metallized layer therebeneath and a second wafer of semi-conductor material having a groove in a bottom face against which is received a metallized layer. The first wafer metallized face is then adhesively bonded to the second wafer on a surface opposite the metallized layer to which a circuit is affixed. The second wafer metallized face and metallized grooves cooperate with the first wafer metallized face to provide a shielded circuit cavity therebetween. Alternatively, the first or second wafer can be used alone to partially shield a circuit element.

11 Claims, 10 Drawing Sheets

OTHER PUBLICATIONS

David Maliniak; Technology Advances; Electronic Design, Jun. 13, 1994.

Tewksbury and Hornak; Can Optoelectronic and Silicon Chips be Monolithically Integrated?; Laser Focus World, May 1994, pp. 151–156.

Markus Yap, Yu–Chong Tai, William R. McGrath, Christopher Walker, Silicon Micromachined Waveguides for Millimeter and Submillimeter Wavelengths; Third International Symposium on Space Terahertz Technology, pp. 316–323.

Katehi, Rebiez, Weller, Drayton, Cheng, Whitaker; Micromachined Circuits for Millimeter–and–Sub–Millimeter––Wave Applications; IEEE Antennas and Propagation Magazine, vol. 35, No. 5, Oct. 1993, pp. 9–17.

Drayton, Katehi; Micromachined Circuits for Mm–Wave Applications; presented at the 23rd. European Microwave Conference—1993, pp. 1–6.

Drayton, and Katehi; Development of Miniature Microwave Circuit Components Using Micromachining Techniques; 1994 IEEE MTT–S International Microwave Symposium—1993, pp. 1–8.

Linda P.B. Katehi; Novel Transmission Lines for the Sub-millimeter–Wave Region; Proceedings of the IEEE vol. 80, No. 11, Nov. 1992, pp. 1771–1787.

Dib, Harokopus Jr., Katehi, Ling, and Rebeiz; Study of a Novel Planar Transmission Line; 1991 IEEE MTT–S Digest, pp. 623–626.

J. Auzins and R.V. Wilhelm; Automative Electronics; IEEE Potentials, pp. 32–36, adapted and reprinted from IEEE Circuits & Devices, vol. 10, No. 1, Jan. 1994.

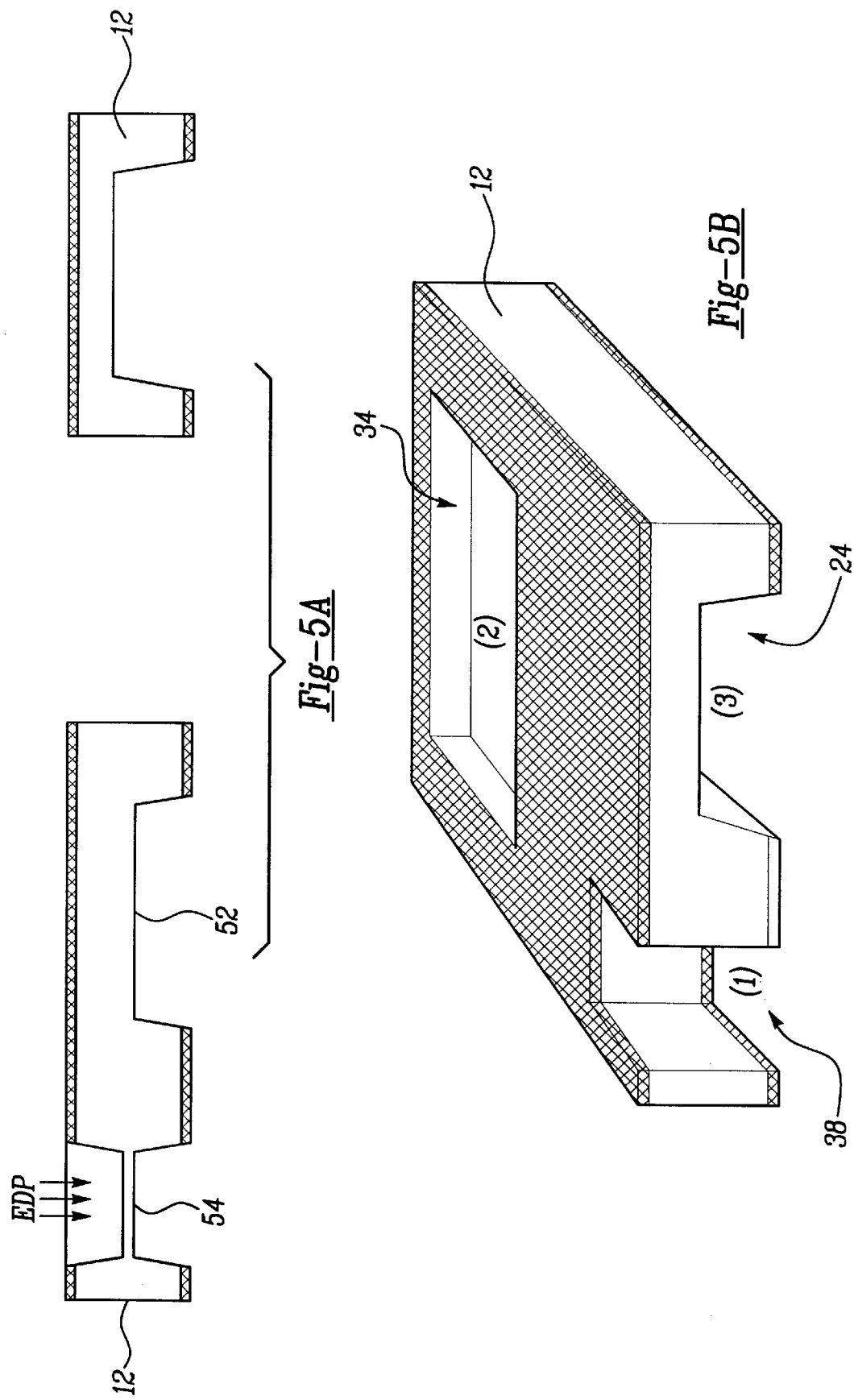

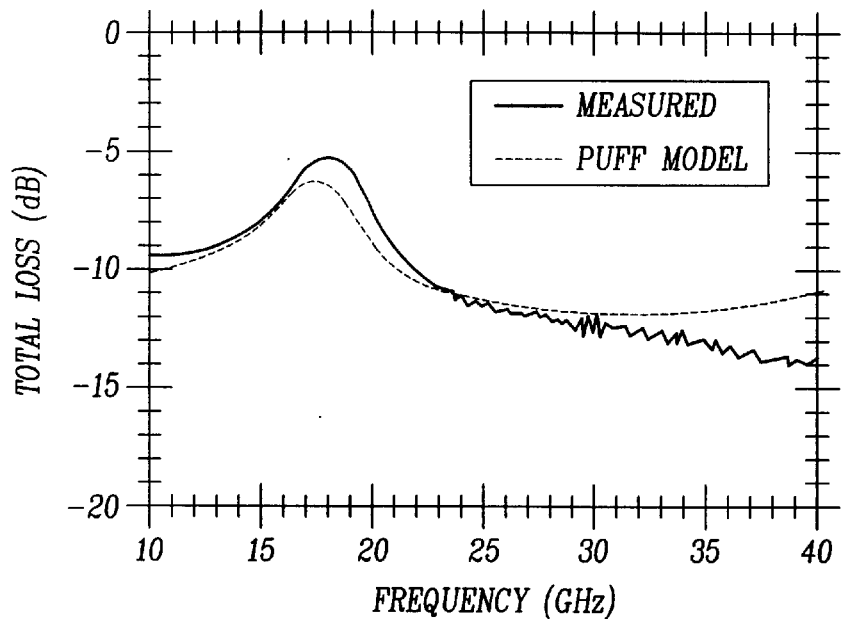
*Fig-8D*
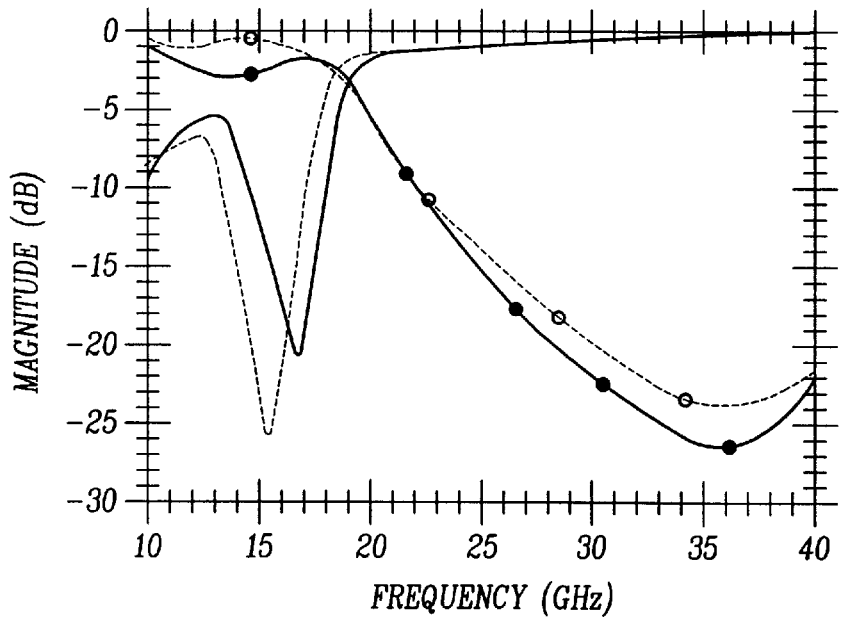
*Fig-8E*
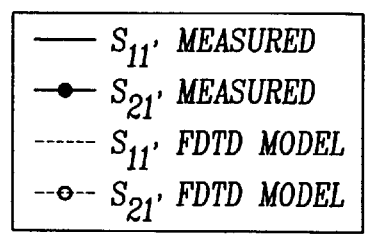

MICROMACHINED SELF PACKAGED CIRCUITS FOR HIGH-FREQUENCY APPLICATIONS

This is a division of U.S. patent application Ser. No. 08/301,131, filed Sep. 6, 1994, now U.S. Pat. No. 5,608,263.

FIELD OF THE INVENTION

This invention relates to micromachined circuits, and more particularly to a self packaged monolithic circuit which is micromachined to shield at least a portion of the circuit especially for high frequency applications.

BACKGROUND OF THE INVENTION

Previously, planar transmission lines such as conventional microstrip, stripline, and co-planar waveguide (CPW) have been utilized to construct conventional structures when designing microwave and millimeter wave circuits. These transmission lines allow for the fabrication of passive components having predefined electrical functions and further enhance the ease in mounting active devices through their conventional structures. Almost forty years ago the stripline was introduced as a new and revolutionary hybrid technology which has evolved and is presently applied to monolithic technologies where it drastically increases operating frequencies and also consequently reduces weight and volume. In conventional planar transmission lines such as the co-planar waveguide, power is propagated by creating an RF voltage difference between a pair of planar conductors printed on a common surface. Alternatively, both stripline and microstrip propagate power by creating an RF voltage difference between two planar conductors printed on opposite surfaces of a dielectric slab structure. In both of these cases, the geometry of the conventional planar transmission lines permits greater design flexibility, tremendously reduces space occupied by the circuit, and contributes to realizing very large scale, very high frequency applications. Although microstrip and stripline have been utilized more so in passive circuits, limitations in mounting active devices have made the use of co-planar waveguides more popular since its physical geometry accommodates the incorporation of active devices. However, it is commonly observed that a degradation in circuit performance results from circuit crowding with active and passive devices due to coupling mechanisms associated with parasitics which are excited along with radiation effects that arise when utilizing the above in dense circuit environments.

Whereas the planarization of conductors by the aforementioned transmission lines provides integration capabilities, fringing is generated in the electro-magnetic fields which leads to unwanted mechanisms such as radiation and dispersion, and enhanced OHMIC losses and electromagnetic coupling. Each of these mechanisms are dependent on the frequency, and become seriously limited as the submillimeter frequency range is approached. An effort was made to find new geometries which reduce or eliminate the aforementioned losses and coupling mechanisms but do not affect the monolithic character of the transmission line, therefore allowing for extension of operating frequencies long into the Terahertz region, thereby improving circuit performance in existing applications. Typically, planar circuits have been enclosed in shielding cavities in order to resolve these problems. However, in most cases, the cavities must be placed away enough from the circuit in order to avoid proximity effects and they must be sufficiently small enough to avoid cavity-resonances that interfere with circuit electrical performance.

Furthermore, most high frequency circuits are presently developed before they are packaged in a shielding housing wherein the development, modeling, fabrication and experimental characterization of the systems are performed prior to packaging. Therefore, the effects of a housing on the electrical performance of the developed circuit becomes very difficult to predict. As a result, the electrical response of many packaged circuits suffers significant performance degradation mainly due to the introduction of unwanted parasitics along with the excitation of multiple shielding resonances resulting from the interaction between a circuit board and a metallic housing. Furthermore, while shielding with metallic housings is possible in many circuit applications, in monolithic arrays where the circuit environment must remain open, radiation from feeding structures and parasitic coupling to radiating elements has been a major problem.

A previous effort by one of the present inventors involved the development of a microshield line in an attempt to improve performance over dimensional microstrip or co-planar structures in order to reduce radiation losses and electromagnetic interference. The microshield line is a monolithic line suitable for circuit or array applications. With this device, an inner conductor is coupled with a ground plane which is deformed from the original planar geometries of previous devices in order to totally or partially surround the inner conductor while still having the form of a printed strip. The structure is generally made monolithically using etching and metal deposition techniques. In the preferred version, the inner conductor is suspended in air by mounting the conductor on a membrane. Typically, the ground plane surrounds the inner conductor and prevents radiation effects. However, conductor loss is still present with this structure. Furthermore, circuit implementations with this device are limited to cases where a circuit can be suspended in air by use of a membrane. While such a construction facilitates hybrid use with some passive and active circuit components, it does not allow for the construction of more complex circuits due to limitations on the size of the fabricated membrane, as well as the limited structural support provided by the membrane to the circuit elements.

SUMMARY OF THE INVENTION

In accordance with this invention, monolithically integrated cavities are developed which provide effective shielding of specific circuit components while maintaining an overall geometry which is small enough to avoid multiple resonance excitation in the range of operating frequencies, and further addresses problems of proximity coupling between adjacent circuit elements. Preferably, a pair (or more) of semi-conductor wafers are adhesively bonded together to form a micromachined self packaged circuit which creates a shielding environment that is monolithically integrated via cavities in both the upper and lower wafers which cooperate with a circuit contained therebetween to define the shielded environment. Alternatively, a single wafer from the aforementioned pair is used in a partially shielded and packaged circuit. Wafer cavities are produced by using micromachining techniques to develop miniature circuit components for use in high frequency systems.

For example, a micromachined circuit can be completely shielded inside such a monolithic device and can include a planar transmission line of co-planar type which is surrounded by an air-filled cavity in the upper wafer region and a substrate-filled lower cavity in the lower wafer which is beneath the line. In this manner, a conventional housing element is eliminated which proves rather expensive and impractical to optimize for such a circuit configuration. For system-level designs where weight and volume reduction as well as controllable parasitics are critical issues, the overall system costs are directly reduced utilizing this technique. Both satellite and mobile communications can benefit from the development of miniature micromachined microwave components according to this invention.

A variety of micromachining processes are suitable for specific design requirements of shielding and isolation, namely a preferred etching process is utilized to micromachine wafers to obtain a self packaged circuit which is at least partially shielded to obtain desired electrical performance at necessary frequencies. Applications of micromachined circuits constructed with shielding of this invention are given by a simple circuit component such as an antenna/array network, a tuning stub, or a filter. A comparison of the performance of selected components has been performed against conventional transmission lines, namely co-planar waveguide. The results show micromachined self packaged circuits with monolithically integrated shielding surrounding the planar geometries that are improved over conventional devices, and which are comparable to expected theoretical results.

Objects, features and advantages of this invention are to provide monolithically integrated shielding for use in a self packaged circuit which is micromachined into semiconductor wafers to construct the device. Furthermore, a method of making such a device is disclosed which greatly reduces cost, complexity, and size, and resolves problems of proximity coupling and cavity resonance to shield selected individual circuit components while maintaining an overall geometry which is small and avoids multiple resonance excitation in the desired range of operating frequencies. Furthermore, the device and method of this invention greatly simplifies and facilitates implementation of circuits having discretely shielded components which is readily and easily adapted to mass production of such circuits, and is relatively simple, economical and reliable to manufacture.

Further objects, features and advantages of the invention will become apparent from a consideration of the following description and the appended claims when taken in connection with the accompanying drawings.

BRIEF DESCRIPTION OF THE DRAWINGS

FIG. 3 is a partial perspective view taken generally along line 3—3 of FIG. 2a;

FIGS. 5a and 5b depict various stages of micromachining used to produce the upper wafer of FIGS. 1–3;

FIG. 7b is a plot of measured versus theoretical results for the circuit of FIG. 7a;

FIGS. 8b–e are plots of various performance parameters comparing measured and modelled results for the circuit of FIG. 8a;

DETAILED DESCRIPTION OF THE PREFERRED EMBODIMENT

For applications where it is necessary to partially or completely shield a circuit, a micromachined circuit package forms a micropackage for use in high-frequency applications. A pair of wafers are joined together which utilize cavities in conjunction with metallized layers to form shielded environments therebetween for encasing circuit elements. If it is necessary to directly expose a circuit element with the external environment, a window can be provided which exposes a circuit element through the micropackage. For example, an antenna or detector can be incorporated in a micropackage which extends through a window to facilitate operation.

Figure 1:
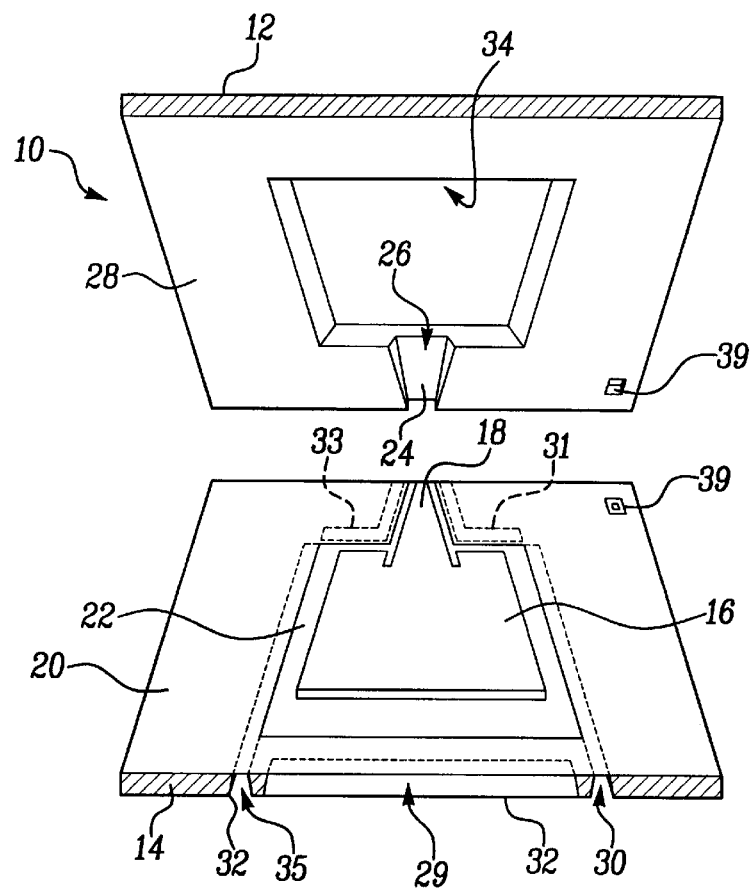
FIG. 1 is an exploded perspective view of a monolithically integrated micromachined self packaged microwave antenna/array network in accordance with this invention.
Figure 2A:
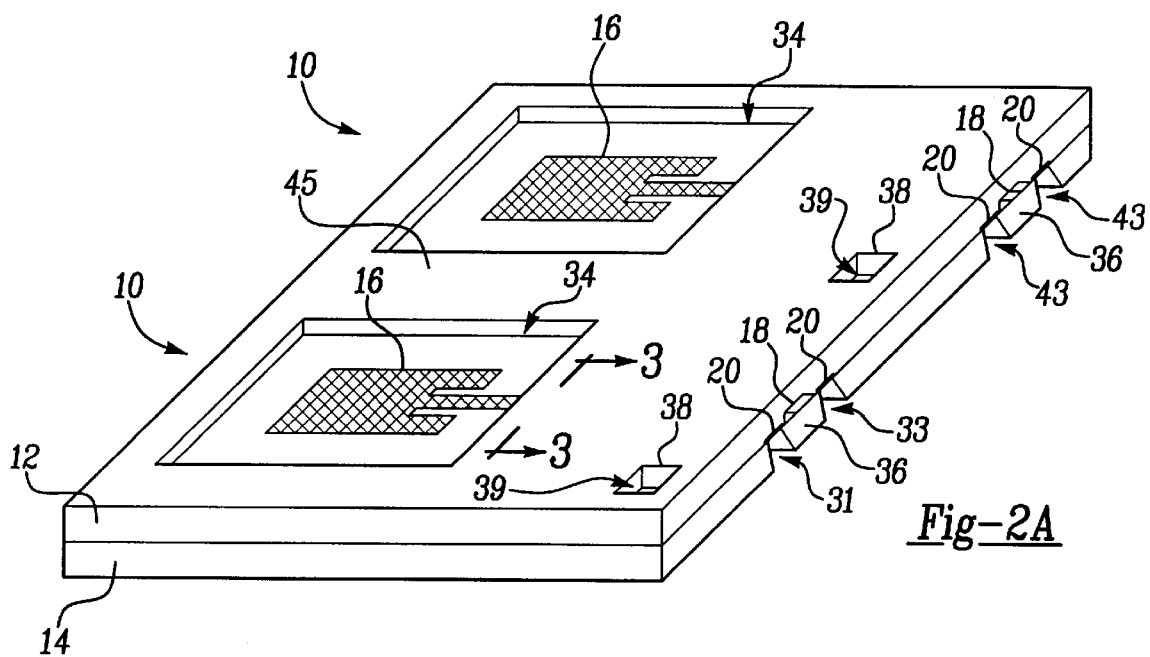
FIG. 2a is an assembled perspective view of the device depicted in FIG. 1 configured in an antenna array.
Figure 2B:
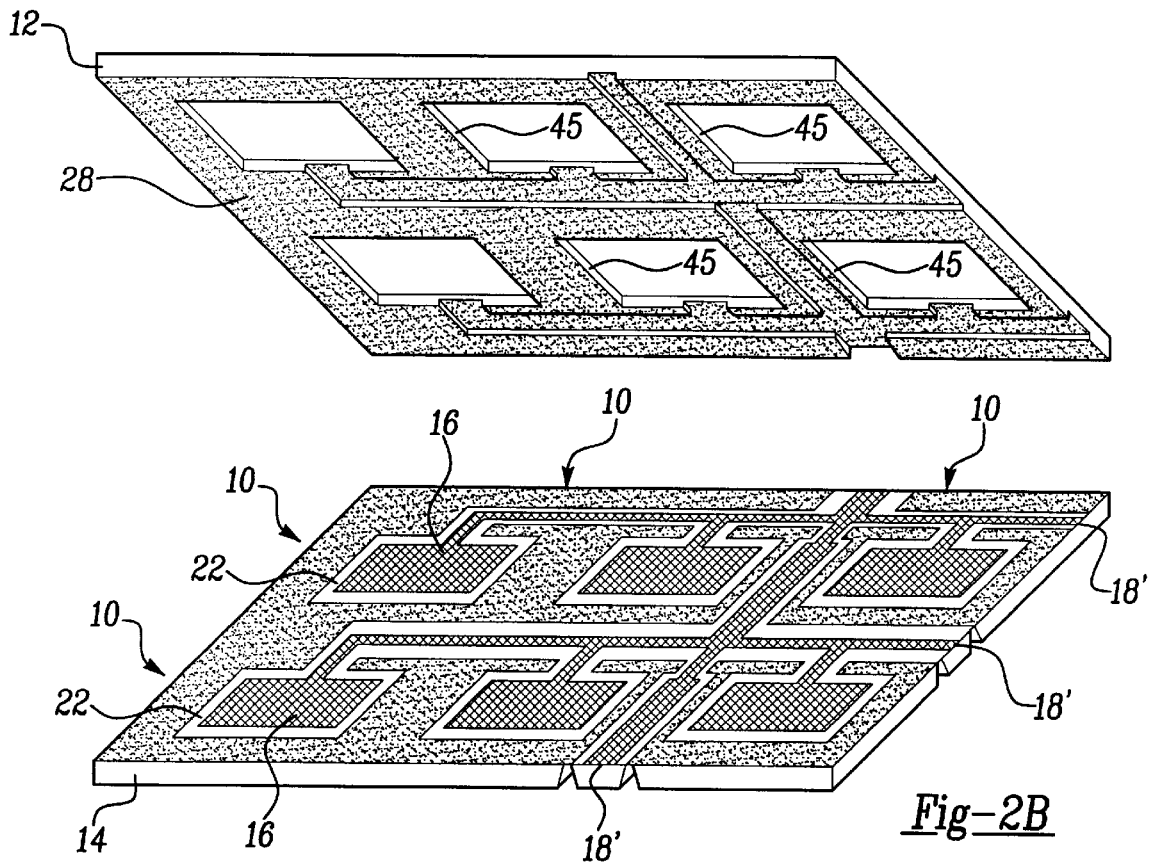
FIG. 2b is an exploded perspective view of the device depicted in FIG. 1 configured in an alternative antenna array having an integrated feeding line network.

In accordance with this invention, a preferred embodiment is shown in FIGS. 1 and 2 wherein an antenna/array network 10 is micropackaged between a pair of metallized wafers 12 and 14. Preferably, wafers 12 and 14 extend beyond the edge boundaries depicted in FIG. 1 to provide for a plurality of networks 10 incorporated therebetween as shown in FIGS. 2a and 2b. Alternatively, a single network 10 can be constructed in micropackaged configuration as depicted in FIG. 1.

As shown in FIG. 1, antenna/array network 10 is formed from a patch antenna 16 and feed line 18 which are integrally centrally formed on the bottom wafer 14. Preferably, the patch antenna and feed line which form a circuit have a planar geometry which is printed on the bottom wafer 14 using standard photolithographic techniques. Initially, a surrounding metallized ground region 20 is concurrently printed on wafer 14 therearound. A peripheral aperture 22 is formed about the circuit comprising patch antenna 16 and feed line 18 to electrically isolate the antenna circuit from the ground plane 20. An upper cavity 24 is micromachined in the bottom face of upper wafer 12 which forms an air-gap 26 about feed line 18. Additionally, a window 34 is formed through upper wafer 12 by micromachining upper cavity 24 completely through the upper wafer in the region above antenna 16 which allows antenna 16 to transmit and receive RF signals from within the micropackaged network 10. A metallized layer 28 is then photographically deposited on the bottom of wafer 12, including within upper cavity 24.

Likewise, a plurality of elongate lower grooves 29, 30, 31, 33, and 35 or elongate vias, are micromachined in a bottom face of lower wafer 14 so as to substantially circumferentially encompass the wafer region beneath patch antenna 16 as well as the antenna and fully extend to ground plane 20 so that a metallized layer 32 which is subsequently deposited using lithography and metallization techniques on the bottom of wafer 14 and in groove 30 contacts ground plane 20 substantially circumferentially about the patch antenna and feed line circuit therein.

Alternatively, a single substantially completely encompassing elongate groove 43 can be constructed and arranged about a circuit in order substantially encompass the circuit and to provide metallized communication between the upper wafer metallized layer 28 and the lower wafer metallized layer 32. The single metallized groove 43 is suitable for applications where the bottom wafer 14 is micromachined subsequent to bonding the wafer to upper wafer 12. With this assembly and etching procedure, the importance of maintaining structural integrity of the lower wafer is not an issue. However, when micromachining lower wafer 12 prior to assembly, it is preferred to micromachine a plurality of grooves 29, 30, 31, 33, and 35 as depicted in FIG. 1 since structural bridges are provided between adjacent grooves which supports the central region of the wafer by the wafer outer periphery. Such a plurality of grooves still substantially encompasses the wafer region beneath the patch antenna, as well as the feeding line to obtain a substantially shielded affect on the region beneath the circuit.

As shown in FIG. 2a, the upper and lower metallized wafers 12 and 14 are bonded together preferably with an adhesive using regular adhesion methods, for example a metallized epoxy, such that metallized layer 28 and ground plane 20 substantially bond together therebetween. Alternatively, the wafers can be mechanically fastened together, using electobonding or other techniques. In the assembled configuration, it is readily apparent that patch antenna 16 can receive RF signals through window 34 while feed line 18 is substantially shielded from such affects. Furthermore, the geometry of cavity 24 is sized in proportion to feed line 18 to substantially eliminate the excitation of multiple shielding resonances which might result from interaction between the feed line and the metallized layers of network 10.

Alternatively, FIG. 2b depicts a micromachined antenna array constructed from a plurality of networks 10 having a horizontally integrated feeding line 18'. The alignment windows 38 and alignment marks 39 are not necessary, since the plurality of windows function to facilitate alignment between the wafers 12 and 14.

More particularly, antenna 16 is partially shielded while maintaining a window 34 for RF communication therethrough and feed line 18 provides a planar transmission line of co-planar type which is surrounded by an air-field cavity or air-gap 26 on top, and a substrate-filled portion 36 formed by the region of wafer 14 which is encased by metallized grooves 29, 30, 31, 33 and 35, or alternatively by continuous groove 43, therebeneath as shown in FIGS. 1, 2a, and 2b. In order to address the specific design issues encountered when shielding and isolating a typical circuit, a variety of micromachining processes are presently available and several approaches will provide circuits with enhanced electrical performance-at desired frequencies.

The device of FIGS. 1–5 demonstrates the concept of a micromachined circuit for use in RF applications by giving a simple circuit component, namely an antenna 16 and feed line 18. Alternatively, several variations of devices will be shown hereinafter. Several of the devices presented herein have been developed and their performance has been measured and compared to conventional transmission lines, and in this case particularly co-planar waveguides. Applicants have currently tested circuits with monolithically integrated shielding according to this invention which surrounds planar geometries, and the results indicate a comparison to theoretically expected values for a fully shielded device and further indicate overall improvement in performance.

WAFER FABRICATION PROCEDURES

The antenna/array network depicted in FIGS. 1 and 2 utilizes a two-silicon wafer system 12 and 14. The crystal orientation of each wafer combines with the etching techniques to provide an etch stop in the micromachining of the silicon wafers. Alternatively, GaAs can be utilized for one or both wafers. For high frequency circuit applications, the fabrication processes are new although their use has been shown in general microstructures work. An understanding of micromachining technology as it relates to high frequency circuits is hereinafter presented as it applies to monolithically shielded circuit geometries.

The micromachined self-packaged circuit shown by antenna/array network 10 in FIGS. 1 and 2 has a shielded environment which has been monolithically integrated into a two-wafer system, namely wafers 12 and 14, and is made up of metallized cavity 24 and elongate grooves 29, 30, 31, 33 and 35 which are respectively formed in the upper and lower regions of upper wafer 12 and lower wafer 14, respectively. As shown in FIG. 1, the air-gap 26 which is formed by upper cavity 24 is metallized by layer 28 while the lower region which is formed by the continuous elongated grooved 29, 30, 31, 33 and 35 that are subsequently metallized provides a substrate-field cavity 36 of silicon which is used to construct lower wafer 14. Preferably, the wafer 14 is formed from high resistivity silicon, wherein $E_r=11.7$. As was discussed infra, a response of antenna 16 from RF signals received through window 34 is measured with feed line 18.

FIG. 2b depicts a plurality of antenna/array networks 10 which are formed on wafers 12 and 14 as they are commonly configured together on a single wafer construction to provide an antenna array. Each network 10 is constructed identical to the network depicted in FIG. 1. However, each window 34 is now separated by a bridge 45 which strengthens upper wafer 12 over that which would be provided by forming a single common window in the wafer for use by both antennas 16.

Figure 3:
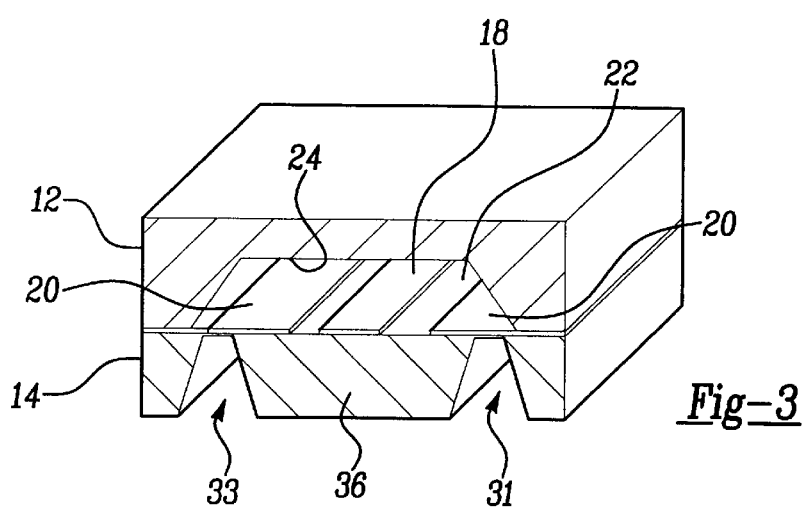

FIG. 3 generally depicts a partial-sectional view taken along 3—3 of FIG. 2a for one of the networks 10 wherein feed line 18 is a grounded co-planar waveguide (feeding line) which measures the response of antennas 16 to RF signals received via windows 34. Each feeding line 18 is shielded within the local air-gap 26 from above as well as the substrate field cavity 36 formed locally therebelow and is further grounded through direct contact with the ground plane 26 formed on either side of the co-planar feed line 18. Other important design issues necessitate the development of accurate alignment marks between the top and bottom wafers 12 and 14 in order to ensure repeatable alignment therebetween during the bonding of the two wafers. Likewise, a mechanism is also needed for exciting individual circuits which are shielded within a monolithic self-packaged circuit. Finally, a shielding environment is also desired which can be incorporated into a monolithic self-packaged circuit for individually shielding circuit components.

In order to address the above issues, the alignment of wafers 12 and 14 is facilitated by providing at least one, and preferably a plurality, of alignment or probe windows 38 which are formed in wafer 12 and which align with etched marks 39 provided on top of wafer 14 concurrent with formation of circuit deposition. The second issue is addressed by incorporating a probe or access window, for example window 34 which is disclosed in the network device 10 of FIGS. 1 and 2. Finally, the last issue is addressed by developing a substrate-filled cavity such as cavity 36 beneath a feeding line 18 on the lower wafer 14 in conjunction with a complementary corresponding air-filled cavity or gap 26 which is likewise formed over the feed line in the upper wafer 12. Descriptions of individual wafer construction and layering is discussed hereinafter in relation to the embodiment depicted in FIGS. 1, 2a, and 2b which are necessary in order to construct the completely shielded micromachined circuit and network 10 of FIGS. 1, 2a and 2b.

Figure 4A:
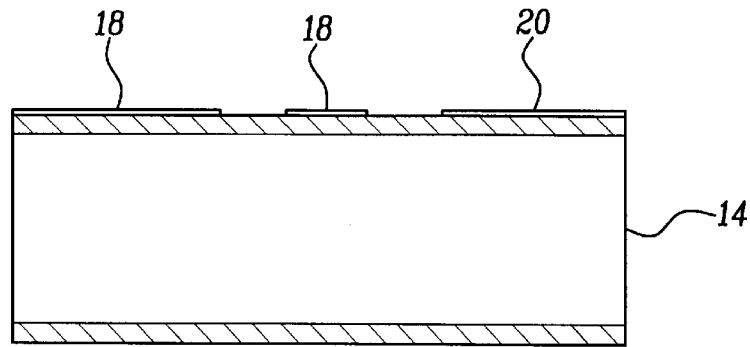
FIGS. 4a–c depict various stages of micromachining used in constructing the lower wafer of FIGS. 1, 2a and 2b.
Figure 4B:
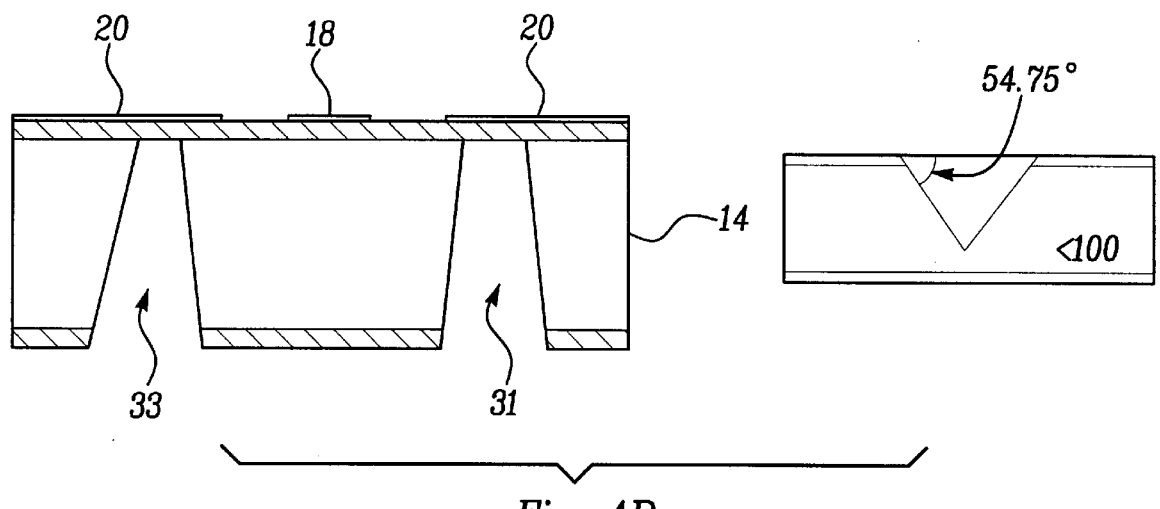

As shown in FIG. 4, the lower wafer 14 is formed from a high resistivity, single-side polished silicon 44 having a dielectric mask 46 of silicon dioxide with a wafer thickness of 350 $\mu$m. In order to develop circuits on the wafer, planar lines which form the circuit are printed using standard photolithographic techniques and a seed layer of titanium/gold/titanium is initially evaporated and then electroplated to achieve the appropriate metal thickness, preferably at three skins depth, or in this case three microns. In addition to printing the circuit via planar lines, alignment marks are also likewise printed, preferably in the lower wafer 14 which align with alignment windows 38–41 for facilitating aligned bonding of wafers 12 and 14 together. Subsequent to printing the circuit and alignment marks on wafer 14, the bottom or lower side of wafer 14 is patterned using an infra-red alignment to expose regions of the wafer bottom that form the lower cavity, namely elongated grooves 29, 30, 31, 33 and 35, or alternatively continuous groove 43.

Additionally, any electroconductive cavities or via's (not shown) which must be incorporated in the circuit can likewise be formed concurrently with elongated grooves 31 and 33. Since such cavities including grooves 31 and 33 must be underneath the respective individual circuit elements, in electrical communication with each circuit element metallized ground plane 20, the alignment windows in the lower cavities are defined on the unpolished side of wafer 14.

Figure 4C:
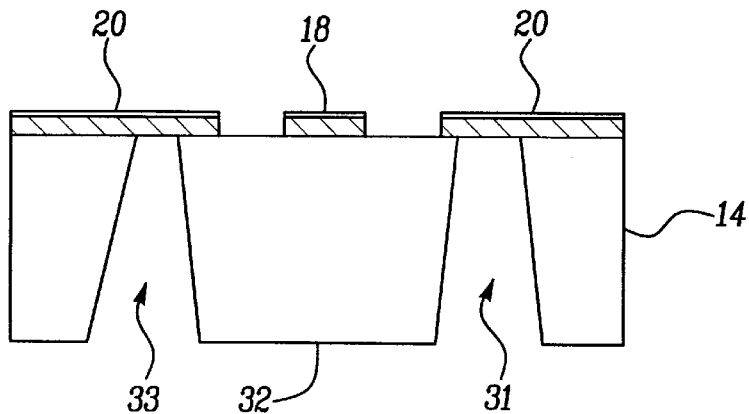

Before anisotropically etching the silicon wafer 14, oxide is removed from the target areas using buffered hydrofluoric acid (BHF). An anisotropic etchent, ethylene diamine pyrocaltechol (EDP), uses the <111> crystal plane 48 of the <100> silicon wafer, as an etch stop which causes an etch angle profile of 54.75° which creates non-vertical side walls in the cavities or elongated grooves 31 and 33 as seen in FIG. 4c. As a result of the etch angle profile, the widest dimension of grooves 31 or 33 is near the bottom face of wafer 14 which is the direction from which it is etched. Prior to evaporating the final metal to form metal layer 32, the oxide in grooves 31 and 33 beneath the ground plane 20 is then removed and then metallized to form layer 32 which electroplates to a metal thickness of preferably 3 microns which forms direct bottom to top metal contact through wafer 14 with ground plane 20.

As shown in FIG. 5b, upper wafer 12 requires patterning or masking of both sides of the wafer prior to etching upper cavity 24, window 34, and alignment window 38. Preferably, a low resistivity silicon wafer is also used which has a thickness of 500 $\mu$m with 7,500 Å of thermally grown oxide on both sides. The alignment window 38, upper cavity 24, and window 34 are etched onto corresponding sides of wafer 12 in a desired geometry using photolithography. A thin metal layer of Ti/Au is then evaporated for a lift-off procedure to mask the remaining silicon. This additional masking layer functions for two purposes: it offers additional protection to the upper cavity along a roof portion 52, and it is used as a mask during infrared alignment to facilitate patterning the lower side of the windows as well as the upper cavities. Before etching, oxide is removed from the areas where silicon is eventually removed by including a structural beam 54 in the alignment or probe windows which increases handling ease during mounting of the upper wafer.

Upon completion of the upper wafer 12, shown in FIG. 5b, and the lower wafer 14, partially shown in FIG. 4c, the metallized wafers are joined together. The upper and lower wafers 12 and 14 form shields which are aligned together via alignment window 38 and alignment mark 39 where the pair of wafers are attached together via a microscope using regular adhesion methods and adhesive.

In the case where a single alignment window 38 and alignment mark 39 are provided in a wafer arrangement having a single antenna (FIG. 1), window 34 further functions as an alignment device wherein window 34 is aligned and mated with the inner edges of ground plane 22 to facilitate aligned bonding of wafers 12 and 14 therebetween. Alternatively, a plurality of alignment windows and marks can be utilized in constructing a network 10. For the device of FIGS. 1, 2a, and 2b, the dimensions of upper cavity 24 and elongated grooves 29, 30, 31, 33 and 35 are 280 and 350 microns, respectively, while their widths are 1178 and 980 microns, respectively. In certain applications where it is only necessary to apply upper shielding to a circuit, it is easy to fabricate a single upper wafer 12 to a common silicon wafer which is easily achieved and which excludes formation of the elongated grooves having a metallized formation therein. Likewise, a single bottom wafer can be used to partially shield a circuit, or it can be used in combination with a shielding cavity housing, or metal cover, affixed thereabove.

Figure 6:
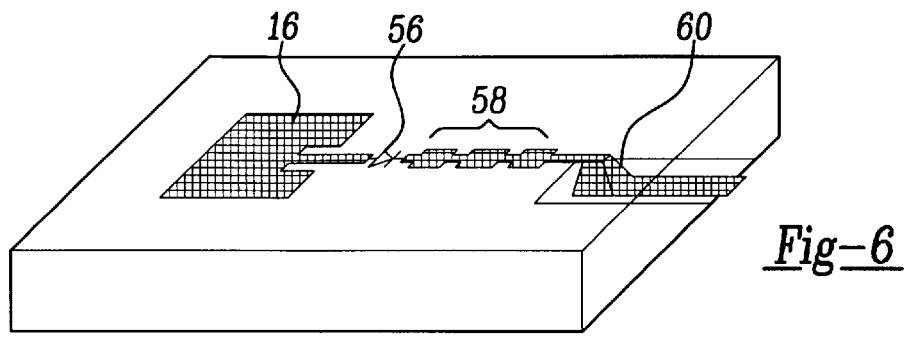
FIG. 6 is a perspective view of a micromachined self-packaged circuit of alternative construction having additional circuit components contained therein for assembly within the device of FIGS. 1–3.

FIG. 6 depicts an alternative construction for the device of FIGS. 1, 2a, and 2b wherein antenna 16 is additionally coupled to a diode 56, a low-pass filter 58 and which through-passes from top-to-bottom through wafer 14' through a via 60 which transfers DC components received from the antenna which are filtered to the bottom side of wafer 14'. In this case, an upper cavity (not shown) similar to upper cavity 24 will assist in shielding feed line 18, diode 56, low-pass filter 58, and the top end of via 60. A top wafer 12 as used in FIG. 1 can be affixed thereto.

Figure 7A:
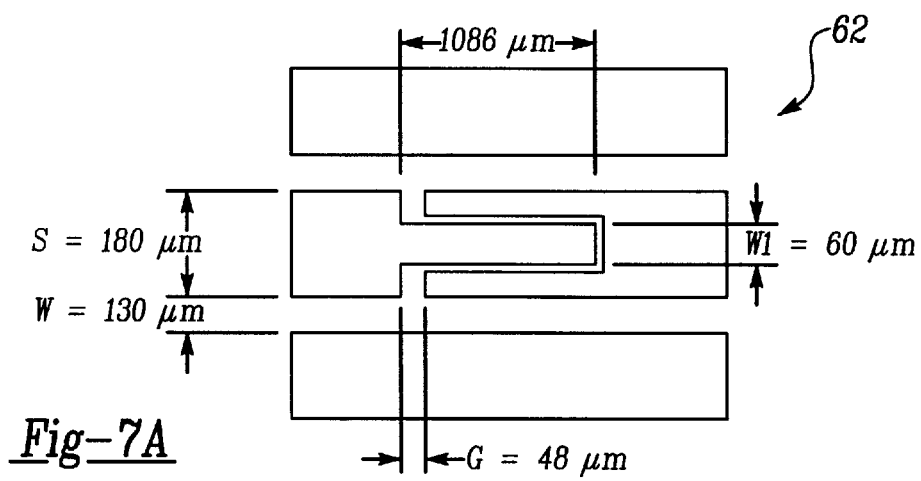
FIG. 7a is a plan view of an alternative embodiment micromachined self-packaged circuit similar to FIGS. 1 and 2 but having the depicted shielded tuning stub circuit provided therein.
Figure 7B:
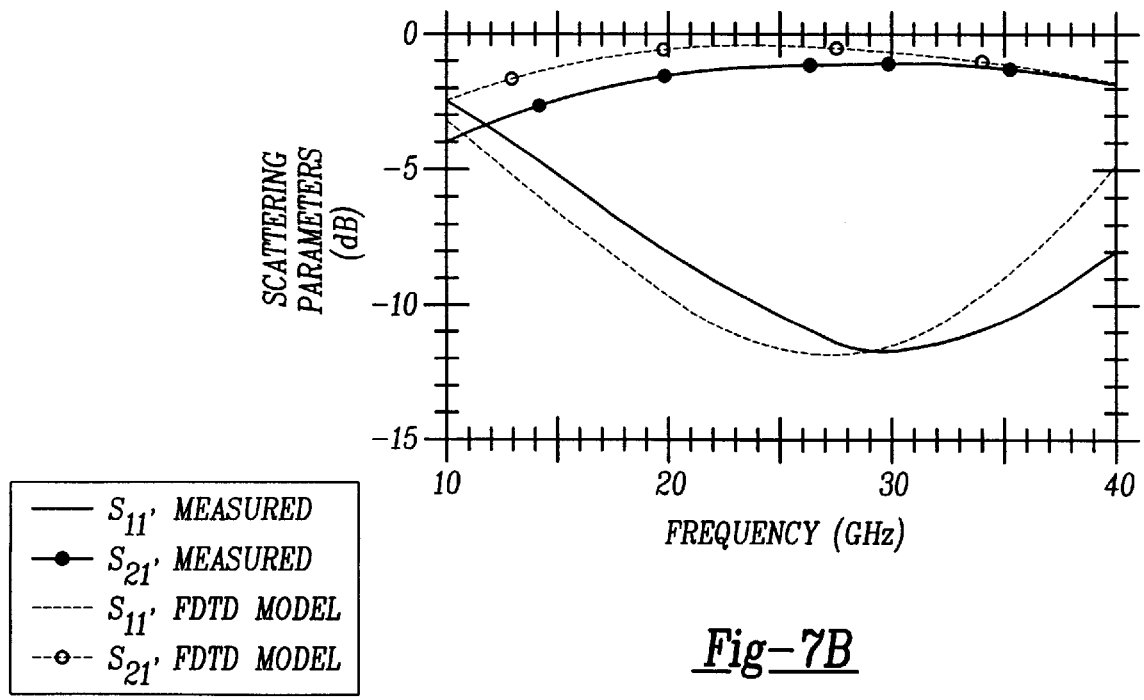

As shown in FIG. 7a, an alternative circuit construction for a micromachined self-packaged circuit is depicted by a series open end tuning stub 62 which has been constructed by the authors with the relative physical dimensions depicted therein. A device has been constructed using the techniques used for forming network 10 of FIGS. 1–5 where tuning stub 62 replaces the antenna 16. A comparison between measurements and full wave analysis results are further given in FIG. 7b. As shown in FIG. 7b, the theoretical and experimental results exhibit a shift in the resonant frequency of about 6.5% since the micromachined resonance of the tuning stub 62 occurs at 29 Ghz compared to a modelled circuit response of 27 GHz. Wherein the overall circuit performance has thus been shown to be similar, the discrepancy in the resonant frequency can be attributed to variations between the actual circuit modelled and the one fabricated and measured. The circuit resonant frequency is affected by the measured line length of the circuit which behaves electrically shorter due to rounding of corners and edges of the stub fingers caused during fabrication. The model did not account for such shortening, and in addition, metal thickness has been neglected although it has been shown to contribute considerably to frequency shifts. Lastly, the difference in magnitude between measurement and theory is further attributed to loss which should be expected, since the theoretical model assumes a lossless system when in reality the circuit inherently has both conductor and dielectric losses.

Figure 8A:
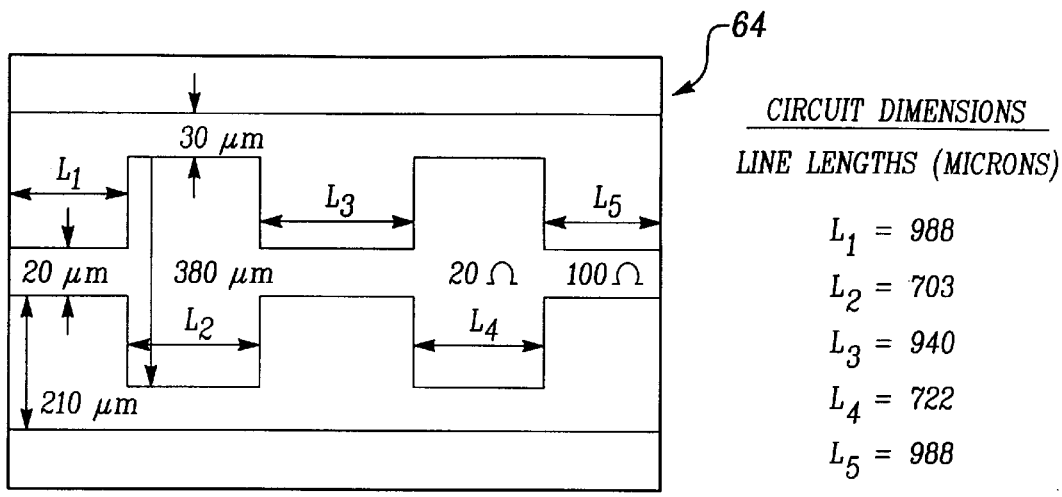
FIG. 8a is a plan view of an alternative embodiment micromachined self-packaged circuit similar to FIGS. 1 and 2 but having the depicted low-pass filter circuit element provided therein.

As shown in FIG. 8a, a five-section stepped-impedance low-pass filter 64 is shown which provides a further alternative embodiment for a circuit used generally in a device similar to network 10 of FIGS. 1, 2a, and 2b. However, in this alternative construction, window 34 is formed over a feedline structure and the filter is covered or completely encased by the upper cavity (not shown) which completely isolates the low-pass filter therein. The window allows on-wafer probing of the feedline structure exposed therethrough. The low-pass filter 64 has both high and low impedance of 100 Ohm and 20 Ohm, respectively, and is surrounded by the cavity structure described above.

Figure 8B:
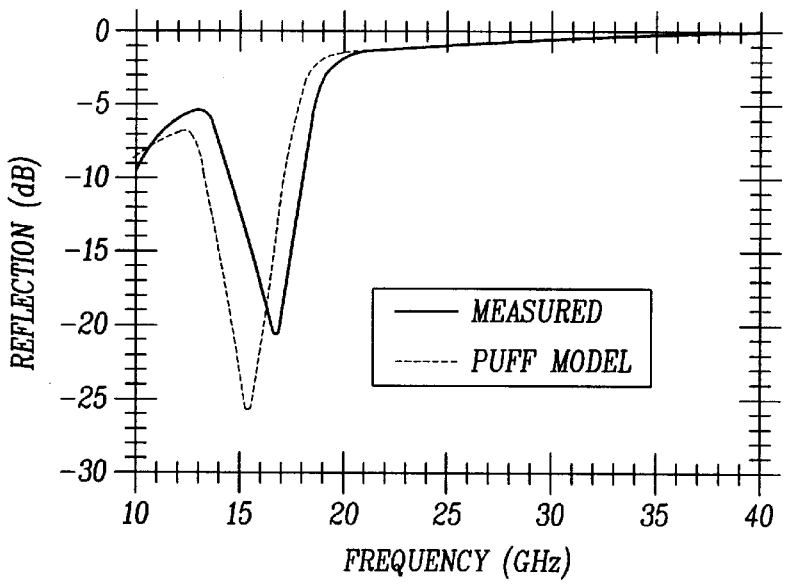
Figure 8C:
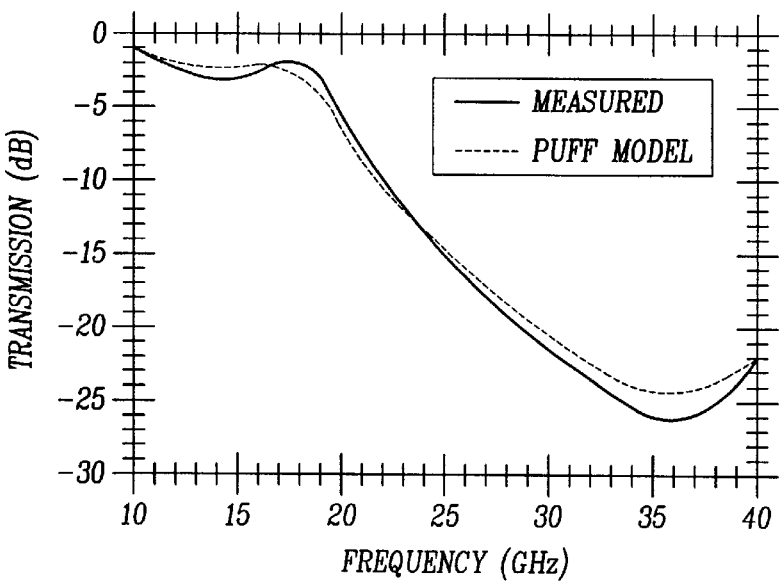

Applicants have constructed and tested the device of FIG. 8a, and FIG. 8b–c shows measurements which are compared to theoretical results derived from quasi-static models where conductor and dielectric losses are included. With respect to conductor losses, care was taken to incorporate the specific metallization thickness and the appropriate surface resistivity which correspond to the various sections of microstrip line widths as previously described in a PhD dissertation by T. E. VanDeventer, "Characterization of Two-Dimensional High Frequency Microstrip and Dielectric Interconnects", Ph.D dissertation, The University of Michigan, December 1992., hereinafter incorporated by reference. In order to realize 100 and 200 Ohm impedance steps, 15 μm and 380 μm wide conductor lines were used with slot widths of 215 μm and 30 μm, respectively. Electrically speaking, the low impedance sections propagate a co-planar waveguide mode due to the narrow slot width defined therein while the high impedance sections propagate a microstrip mode therethrough. These sections of lines are connected in series which results in a mixed mode excitation, thus creating parasitics which can not be easily accounted for in the quasi-static model. Despite this limitation, however, it has been shown that the measured response is similar to the modelled response. In large part, this is due to the relatively low frequency of operation which reduces the effect of the parasitic mechanisms.

FIGS. 8b and 8c depicts a comparison between a PUFF quasistatic model and measured results showing the total loss in the system which further shows substantial agreement between theory and measured results. The PUFF model is a computer aided design package for modelling microwave integrated circuits, and Applicants have used Version 2.0. The PUFF modelled results indicate that the circuits have negligible radiation loss which confirms the effectiveness of the micromachined self-packaged circuit and shield having the filter 64 incorporated in a modified embodiment of FIGS. 1 and 2a wherein window 34 is substituted with an enlarged upper cavity 24. Description of the PUFF model is further described in S. Wedge, R. Compton and D. Rutledge, PUFF Computer Aided Design for Microwave Integrated Circuits-Version 2.0, which is hereinafter incorporated by reference.

FIG. 8d depicts loss response between the PUFF modelled and measured results.

FIG. 8e depicts measured and FDTD theoretic results for a completely shielded five-section low-pass stepped impedance filter. The FDTD (finite difference time domain) model was a version developed at the University of Michigan, Ann Arbor, Mich. Various other similar models are presently commercially available, and several authors have recently described application of such techniques including a book presently published by K. Kunz and R. Luebbers, The Finite Difference Time Domain Method for Electromagnetics, Florida: CRC press, 1993.

Although the PUFF model incorporates the loss effects into the ideal transmission line theory, full-wave analysis for a lossless system using FDTD is much more reliable and accurate in predicting the behavior of the micromachined component in question. PUFF is limited in this respect, since it can not account for parasitics or coupling due to radiation, whereas, the FDTD model has the advantage in that it models the electrical performance based on the exact physical circuit dimensions in both horizontal and vertical dimensions. The results of an FDTD model are depicted in FIG. 8e and show excellent agreement between measurement and theory, except for quantification of loss.

Figure 9:
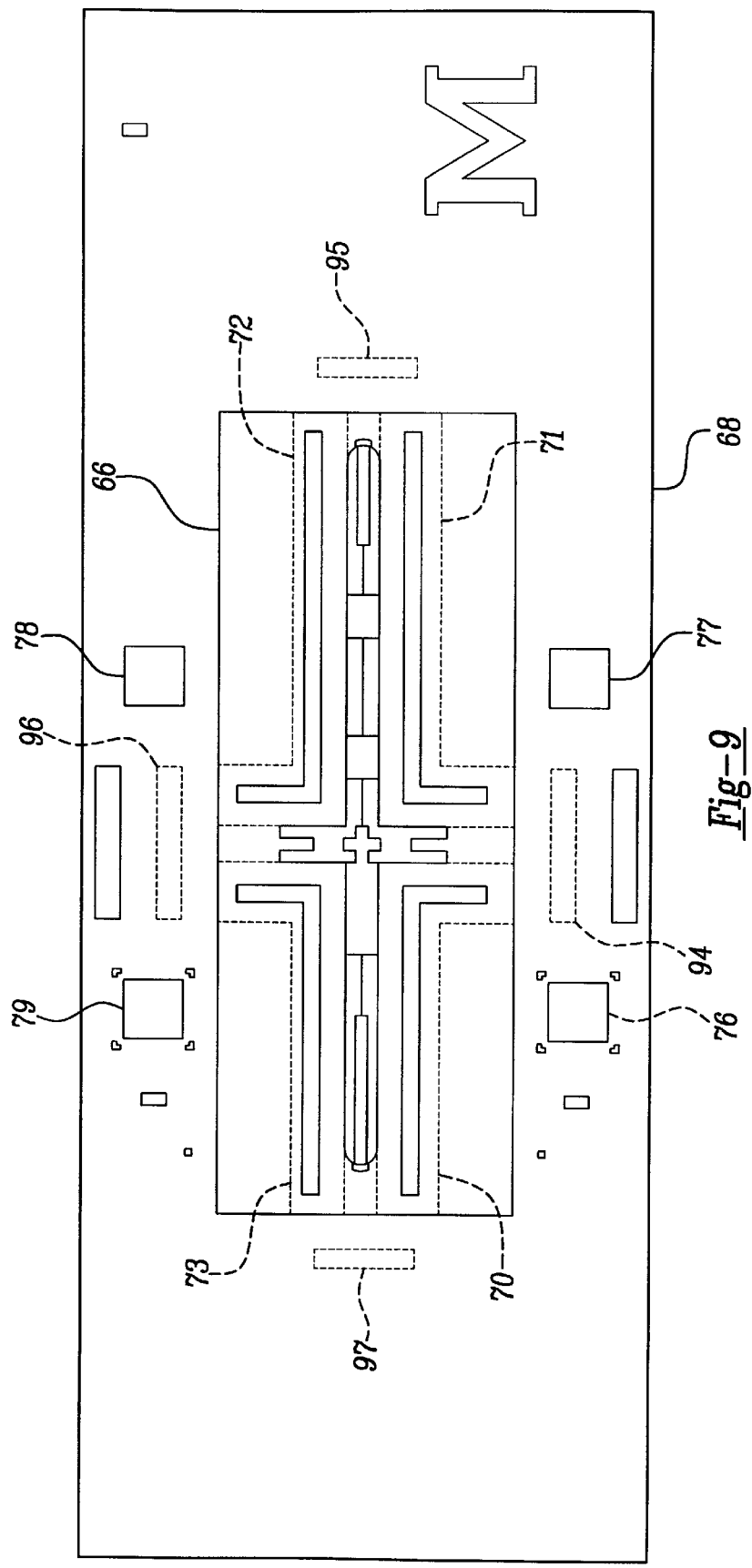
FIG. 9 is a plan view of a fourth alternative embodiment micromachined self-packaged circuit depicting a partially shielded detector circuit geometry provided on a lower wafer prior to assembly.

Implementation of micromachining has further been extended to construct a micromachined self-packaged circuit similar to that shown in FIGS. 1, 2a, and 2b which incorporates a circuit detector 66 depicted in FIG. 9 received in a shielded self-packaged environment for use in high frequency applications. The circuit detector 66 has previously been developed and described in works by I. Bahl and P. Bhartia, Microwave Solid State Circuit Design, John Wiley & Sons, Inc., New York, 1988, Chapter 11, hereinafter incorporated by reference. The inventors have incorporated this circuit detector into a self-packaged circuit, or micropackage, as previously described in the aforementioned embodiments.

Figure 10:
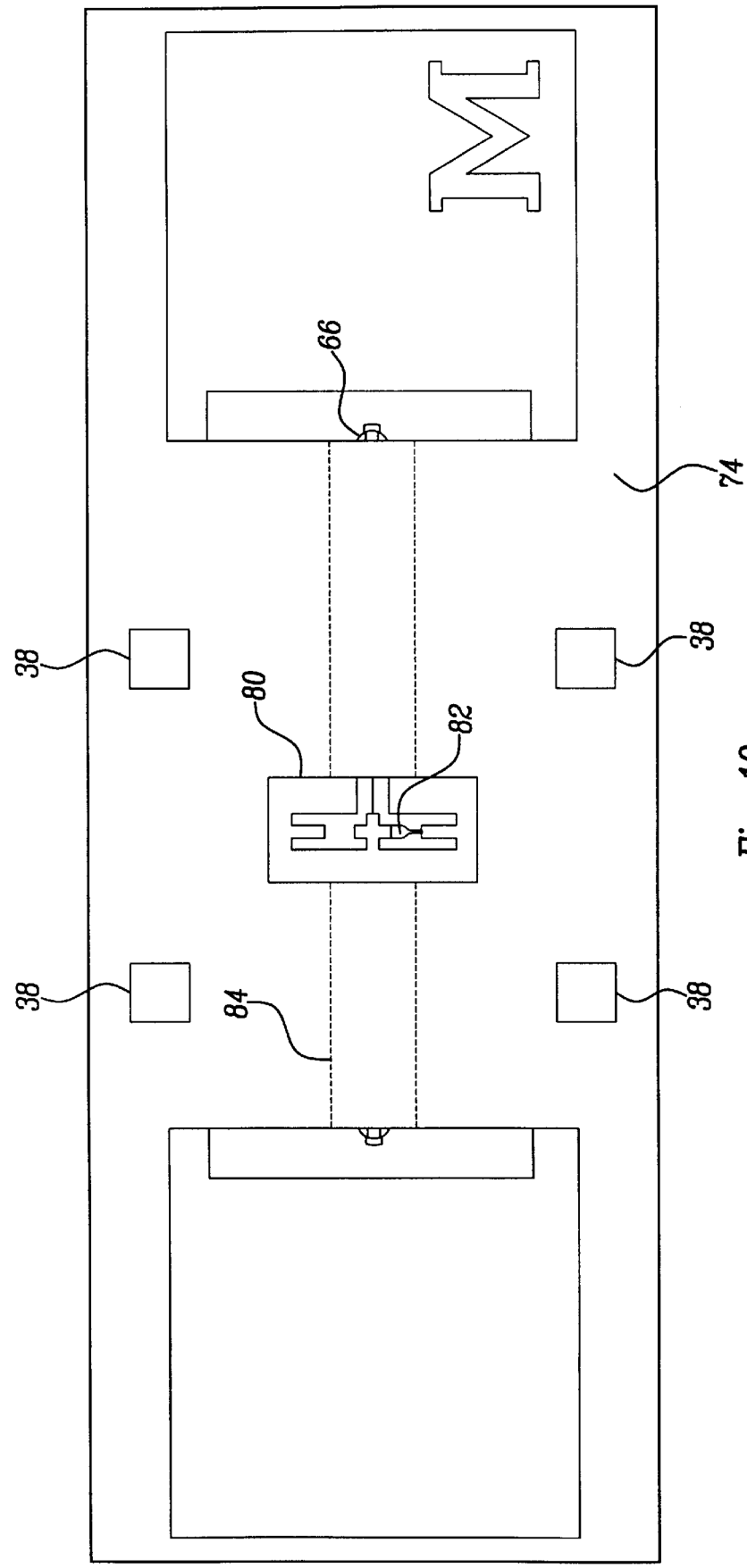
FIG. 10 is a plan view of the device of FIG. 9 subsequent to wafer assembly depicting placement of an upper wafer over the lower wafer and including an active device extending through a wafer window.
Figure 11:
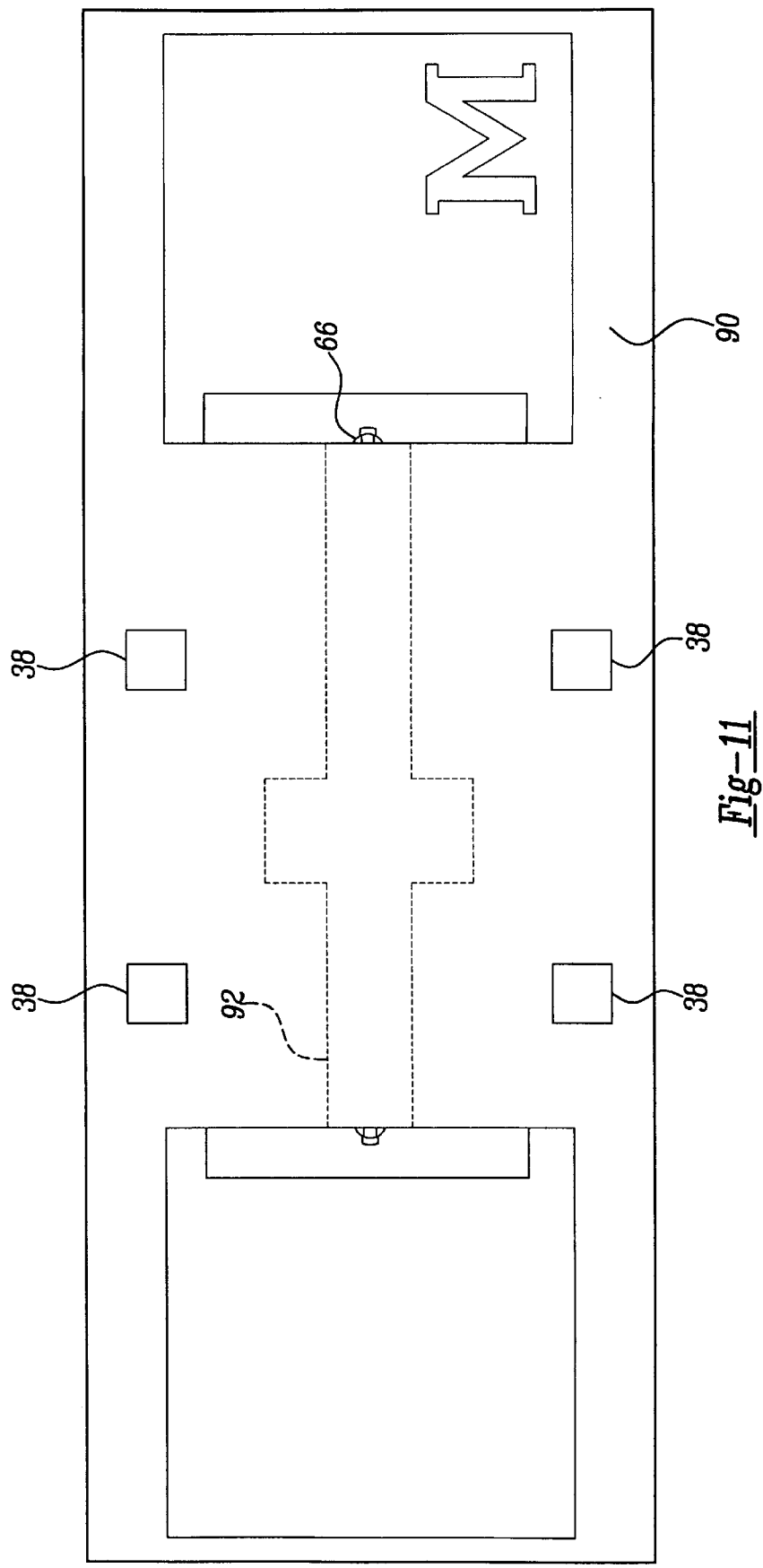
FIG. 11 is a plan view of an alternate configuration of the device of FIG. 10 wherein the circuit is completely shielded by replacing the window with a complete upper cavity.

As shown in FIG. 9, circuit detector 66 has been deposited on a lower wafer 68 including a plurality of elongate L-shaped channels or via's 70–73 and end-channels 94–97 formed therebelow which receive a metallized layer therealong. Likewise, a plurality of alignment windows 38 are provided in an upper wafer 74 as shown in FIG. 10 and 11. Alignment marks 76–79 are formed in lower wafer 64 which facilitate alignment of the upper wafer 74 while it is being bonded to the lower wafer 68. A window 80 facilitates hybrid circuit construction with a pair of diodes, namely diode 82 which is mounted with a corresponding diode (not shown) adjacent thereto such that the pair of diodes receive signals through the window where they communicate with the circuit detector 66. Alternatively, the window facilitates the assembly of the package while assuming the integrity of the diodes. Such a hybrid active and passive circuit design provides component shielding between the lower and upper wafer 68 and 74 which shields portions of circuit detector 66 which are trapped therebetween in corresponding portions of an upper cavity 84 and the elongate channels 70–73 and 94–97 formed beneath the lower wafer 68. A metallized layer 86 is thereafter formed on the bottom face of upper wafer 74, and a metallized layer 88 is likewise formed on the bottom surface of lower wafer 68. Through-wafer metal shielding is provided through lower wafer 68 which contacts the bottom of upper wafer 74 along the regions adjacent elongate channels 70–73 and 94–97. Coaction of the elongate channels 70–73 and 94–97 provides substantially circumferential shielding about the circuit detector 66, excluding action of window 80.

Alternatively, FIG. 11 depicts a modified upper wafer 90 having a continuous complex shaped upper cavity 92 similar to cavity 84, but omitting window 80. In this construction, the complete circuit detector 66 is shielded substantially by upper wafer 90 therebetween. This constructor configuration is especially suited for high-frequency applications and consists of the planar detector 66 being fabricated monolithically in an integrated package. The diodes receive signals from windows or gaps which form on either end edge of the upper wafer 90.

For each of the embodiments shown in FIGS. 9–11, a substrate-field cavity is defined beneath the circuit surface due to the coaction of channels 70–73 and 94–97. The cavity location can be further identified by the L-shaped patterns surrounding the center conducting strip shown in FIG. 9. The patterns are visible in the top of the circuit as a result of the circuit ground plane locally concavely deforming over the channels. The package is completely formed when the upper cavity 84 is mounted over the circuit which contains the diodes, including diode 82 and the omitted symmetrically placed diode (not shown). In the FIG. 10 construction, cavity 84 has been completely through-etched locally to form window 80. Preferably, the package will be formed as shown in the FIG. 11 construction wherein the upper cavity 92 is completely isolated from the surrounding environment. Finally, the performance of a first generation mount has been found to have responsivity of 1680 and 1810 Volts/Meter for lower half-shielded and completely shielded configurations. This appears promising to Applicant's since 2,000 Volts/Meter is considered good. From the preliminary results, introduction of an integrated package to the circuit detector 66 improves the system response significantly.

It is to be understood that the invention is not limited to the exact construction illustrated and described above, but that various changes and modifications may be made without departing from the spirit and scope of the invention as defined in the following claims.

We claim:

1. A method for shielding a circuit comprising:

providing a wafer of semiconductor material having a central region with at least one circuit component for receiving a circuit and a metallized region substantially encompassing said central region on a proximal face and a distal face;

micromachining at least one elongate groove in the wafer distal face so as to substantially encompass the wafer beneath the central region wherein said groove substantially communicates with said proximal face metallized region;

applying a layer of metal to said wafer distal face and said elongate groove so as to define a shielded circuit cavity therebetween; and wherein said wafer provides the shielded circuit cavity therebeneath.

2. The method of claim 1 further comprising the steps of:

providing a second wafer of semiconductor material;

micromachining a recess in said second wafer proximal face;

applying a layer of metal to said wafer proximal face; and affixing said first wafer to said second wafer along respective proximal faces in aligned engagement therebetween so as to define a shielded circuit cavity about said circuit element provided therein.

3. A method of forming a shielded circuit comprising:

providing a first wafer of semiconductor material having a top face and a bottom face;

printing an antenna/array network on said top face of said first wafer;

concurrently defining a ground region on said first wafer substantially encompassing said antenna/array network;

micromachining at least one groove in said bottom face of said first wafer;

depositing a metalized layer on said bottom face of said first wafer;

providing a second wafer of semiconductor material having a top face and a bottom face;

micromachining a cavity into said bottom face of said second wafer;

depositing a metalized layer on said bottom face of said second wafer; and bonding said bottom face of said second wafer to said top face of said first wafer.

4. The method of claim 3 further comprising micromachining a window through said second wafer.

5. The method of claim 3 wherein said metalized layer deposited on said bottom face of said second wafer is also deposited on said cavity.

6. The method of claim 3 wherein said metalized layer deposited on said bottom face of said first wafer is also deposited on said at least one groove.

7. The method of claim 3 further comprising forming a peripheral aperture substantially encompassing said antenna/array network electrically isolating said antenna/array network from said ground region.

8. The method of claim 3 wherein said at least one groove substantially encompasses an area beneath said antenna/array network on said first wafer.

9. The method of claim 3 wherein said metalized layer deposited on said bottom face of said first wafer is also deposited on said ground region.

10. A method of forming a shielded circuit comprising:

providing a high resistivity silicon lower wafer having a dielectric mask of silicon dioxide thereon;

printing planar lines on said lower wafer;

evaporating and electroplating a seed layer on said lower wafer;

forming at least one groove in a bottom face of said lower wafer;

providing a low resistivity silicon upper wafer having dielectric masking of silicon dioxide on both faces thereof;

forming at least one window in said upper wafer;

forming an upper cavity in said upper wafer; and joining said lower wafer and said upper wafer together.

11. The method of claim 10 wherein said seed layer comprises titanium/gold/titanium.

* * * * *

UNITED STATES PATENT AND TRADEMARK OFFICE
CERTIFICATE OF CORRECTION

PATENT NO : 5,913,134
DATED : June 15, 1999
INVENTOR(S) : Rhonda Franklin Drayton, et al It is certified that error appears in the above-identified patent and that said Letters Patent is hereby corrected as shown below:

Column 4, Line 1, "FIGS. 1 and 2" should read --FIGS. 1, 2a, and 2b--.

Column 4, Line 7, "FIGS. 1 and 2" should read --FIGS. 1, 2a, and 2b--.

Column 4, Line 41, "FIGS. 1 and 2" should read --FIGS. 1, 2a, and 2b--.

Column 6, Line 12, "FIGS. 1 and 2" should read --FIGS. 1, 2a, and 2b--.

Column 6, Line 24, "FIGS. 1 and 2" should read --FIGS. 1, 2a, and 2b--.

Column 6, Line 50, "along 3-3" should read --along Line 3-3--.

Column 7, Line 9, "FIGS. 1 and 2" should read --FIGS. 1, 2a, and 2b--.

Column 8, Line 62, "Ghz" should read --GHz--.

Column 10, Line 57, delete "86".

Signed and Sealed this

Twenty-third Day of November, 1999

Q. TODD DICKINSON

Attest:

Attesting Officer

Acting Commissioner of Patents and Trademarks